US010622054B2

(12) United States Patent
Mathew et al.

(10) Patent No.: US 10,622,054 B2
(45) Date of Patent: Apr. 14, 2020

(54) USING RUNTIME REVERSE ENGINEERING TO OPTIMIZE DRAM REFRESH

(71) Applicant: TU KAISERSLAUTERN, Kaiserslautern (DE)

(72) Inventors: Deepak Molly Mathew, Kaiserslautern (DE); Matthias Jung, Homburg Saar (DE); Christian Weis, Kaiserslautern (DE); Norbert Wehn, Queidersbach (DE)

(73) Assignee: TU KAISERSLAUTERN, Kaiserlautern (DE)

( * ) Notice: Subject to any disclaimer, the term of this patent is extended or adjusted under 35 U.S.C. 154(b) by 0 days.

(21) Appl. No.: 16/121,869

(22) Filed: Sep. 5, 2018

(65) Prior Publication Data

US 2019/0074052 A1    Mar. 7, 2019

(30) Foreign Application Priority Data

Sep. 6, 2017    (EP) ..................... 17189685

(51) Int. Cl.
*G11C 11/406*    (2006.01)
*G11C 11/408*    (2006.01)
(Continued)

(52) U.S. Cl.
CPC ...... *G11C 11/40618* (2013.01); *G11C 11/408* (2013.01); *G11C 11/4072* (2013.01);
(Continued)

(58) Field of Classification Search
CPC ......... G11C 11/40618; G11C 11/40611; G11C 11/40622; G11C 11/4072; G11C 11/408;
(Continued)

(56) References Cited

U.S. PATENT DOCUMENTS

| 7,313,047 | B2* | 12/2007 | Kim ..................... G11C 11/406 365/222 |
| 8,072,829 | B2* | 12/2011 | Kim ..................... G11C 11/406 365/222 |
| 9,069,717 | B1 | 6/2015 | Wang et al. |
| 2005/0232049 | A1 | 10/2005 | Park |
| 2006/0203607 | A1* | 9/2006 | Takatsuka ................ G11C 8/18 365/233.5 |

OTHER PUBLICATIONS

Bhati et al., "Flexible Auto-Refresh: Enabling Scalable and Energy-Efficient DRAM Refresh Reductions," ISCA '15, Jun. 13-17, 2015, Portland, OR, US.
(Continued)

*Primary Examiner* — Gene N Auduong
(74) *Attorney, Agent, or Firm* — Patent Portfolio Builders PLLC

(57) ABSTRACT

A method and a related DRAM controller for refreshing a DRAM with an external multi-row, multi-bank refresh function based on optimized command sequences involves determining, at initialization time of the DRAM, inter-operation timing parameters for the external multi-row, multi-bank refresh function, determining optimized timing parameters for row-level activation (ACT) and pre-charge (PRE) commands, and applying the optimized timing parameters for the row-level ACT and PRE commands for refreshing the DRAM with the external multi-row multi-bank refresh function. The auto-refresh function of an SDRAM is replaced.

19 Claims, 4 Drawing Sheets

(51) Int. Cl.
   *G11C 29/02*   (2006.01)
   *G11C 29/50*   (2006.01)
   *G11C 11/4072* (2006.01)

(52) U.S. Cl.
   CPC ... *G11C 11/40611* (2013.01); *G11C 11/40622* (2013.01); *G11C 29/023* (2013.01); *G11C 29/028* (2013.01); *G11C 29/50012* (2013.01); *G11C 29/50016* (2013.01); *G11C 2211/4061* (2013.01)

(58) Field of Classification Search
   CPC ............... G11C 29/023; G11C 29/028; G11C 29/50012; G11C 29/50016; G11C 2211/4061; G06F 13/1636
   See application file for complete search history.

(56) References Cited

OTHER PUBLICATIONS

Chang et al., "Improving DRAM Performance by Parallelizing Refreshes with Accesses," 2014 IEEE International Symposium on High Performance Computer Architecture (HPCA), Feb. 15-19, 2014, Orlando, FL, US.
Search Report dated Feb. 20, 2018 in related EP Application No. 17189685.5.
Bhati et al., "DRAM Refresh Mechanisms, Penalties, and Trade-Offs," IEEE Transactions on Computers, vol. 65, No. 1, Jan. 2016.

\* cited by examiner

USING RUNTIME REVERSE ENGINEERING TO OPTIMIZE DRAM REFRESH

CROSS-REFERENCE TO RELATED APPLICATIONS

This application claims priority under 35 U.S.C. § 119 to European patent application number 17 189 685.5, filed Sep. 6, 2017, the entire disclosure of which is herein expressly incorporated by reference.

FIELD OF THE INVENTION

Exemplary embodiments of the invention generally relate to a method for refreshing a DRAM, and more specifically, to refreshing a DRAM with a novel external multi-row, multi-bank refresh function based on optimized command sequences. The invention relates further to a related DRAM controller.

BACKGROUND

Main memory is in modern computing systems a key component in terms of access speed to data, availability and consistency of data, as well as security. The current trend is to install more and more main memory capacity, in order to avoid paging data in and out from/to slower mass storage devices. In-memory computing has even more increased the requirement for large amounts of main memory.

Main memory is typically implemented in form of DRAMs (dynamic random access memories). These memory devices require a regular refresh of the data. It is known that DRAM refresh is expensive in terms of both, time and energy, and its overhead is getting worse. The cost of DRAM refresh grows linearly with the capacity, which means exponentially with each density generation of memory chips. Modern JEDEC (formerly Joint Electron Device Engineering Council, today JEDEC Solid-State Technology Association) synchronous DRAM (in short SDRAM) use a special auto-refresh command that is opaque to an external memory controller and that handles all refresh operations and timing internally, i.e., internal in the DRAM chip itself.

In order to offset some of the increasing refresh overheads, JEDEC designed the auto-refresh function that uses a highly optimized architecture internally—in particular, the architecture violates the inter-operating timing rules that external controllers must fulfil and obey during normal operation (e.g., for bank PREcharge, row ACTivate and/or column read/write operations). The DRAM can violate external timing parameters internally because during refresh it is understood that, unlike "normal" operations, a read or write operation will not follow the (multi-row) ACTivate operation. The internal mechanism refreshes numeral rows simultaneously (not just one at a time like the external ACT and PRE commands). For the internal auto-refresh function there are no command/address bus constraints. A typical example of an SDRAM is the widely used DDR3 memory.

There exists a large body of research, developing schemes for manual/external refresh of DRAMs row-by-row, characterizing each row's ability to retain data and eliminating unnecessary refresh operations on rows that can be refreshed less often. These schemas have been shown to be very effective because the elimination of the refresh operations improves both energy and performance of the memory system. This has offered the potential of significant gains in DRAM system efficiency.

However, these schemes are incompatible with the modern auto-refresh functions of JEDEC SDRAM specifications. In addition, auto-refresh cannot skip any row, whether that row needs to be refreshed or not.

Thus, the manual/external schemes use explicit row-level Activate (ACT) and Precharge (PRE), and still refresh row-by-row, called Row Granular Refresh (RGR). And because of this, studies have shown that these refresh schemes are unable to exploit the optimizations available internally through the auto-refresh mechanism.

Previous work has promised minimal alterations to the DRAM architecture and protocol, allowing both, row granular protocol of external refresh operations and the use of the internal optimizations (K. K.-W Chang, D. Lee, Z. Chrishti, A. R. Alameldeen, C. Wilkerson, Y. Kim and O. Multu: "improving DRAM performance by parallelizing refresh with accesses" in high-performance computer architecture (HPCA), 2014 IEEE 20th International Symposium, 2014).

Other previous work has also claimed it may be impossible to equal the performance and energy savings of optimized auto-refresh by using individual ACT and PRE, commands, i.e., RGR; compare I. Bhati, Z. Chishti, S.-L. Lu and B. Jacob, "Flexible auto-refresh: enabling scalable and energy-efficient DRAM refresh reductions," in Proceedings of the 42nd Annual International Symposium on Computer Architecture, 2015; and I. Bhati, M.-T. Chang, Z. Chishti, S.-L. Lu and B. Jacob, "DRAM Refresh Mechanisms, Trade-offs, and Penalties," Computers, IEEE Transactions on, vol. PP, no. 99, pp. 1-1, 2015.

Thus, there is a need for the obviously contradictory internal and external refresh mechanisms which seem to exclude each other.

SUMMARY

This need may be addressed by a new method for refreshing a DRAM and a related DRAM controller as disclosed and claimed herein.

According to one aspect of the present invention, a method for refreshing a DRAM with an external multi-row, multi-bank refresh function based on optimized command sequences may be provided. The method may comprise determining, at initialization time of the DRAM, inter-operation timing parameters for the external multi-row, multi-bank refresh function, determining optimized timing parameters for row-level activation (ACT) and pre-charge (PRE) commands, and applying the optimized timing parameters for the row-level ACT and PRE commands for refreshing the DRAM with the external multi-row multi-bank refresh function.

According to another aspect of the present invention, a DRAM controller for refreshing a DRAM with an external multi-row, multi-bank refresh function based on optimized command sequences may be provided. The DRAM controller may comprise a first determination unit adapted for determining, at initialization time of the DRAM, inter-operation timing parameters for the external multi-row, multi-bank refresh function and a second determination unit adapted for determining optimized timing parameters for (row-level activation (ACT) and pre-charge (PRE) commands.

The DRAM controller may also comprise an applying module adapted for applying the optimized timing parameters for the row-level ACT and PRE commands for refreshing the DRAM with the external multi-row multi-bank refresh function.

It may be noted that the multi-row, multi-bank refresh function comprises a novel sequence of signals and may not be intermixed with the internal auto-refresh mechanism of JEDEC SDRAMs. Actually, the disclosed multi-row, multi-bank refresh function may replace the internal auto-refresh mechanism—which is also a multi-row, multi-bank refresh—in the JEDEC SDRAMs. Thus, the new refresh function may be called Optimized Row Granular Refresh ORGR, in contrast to the traditional external RGR (Row Granular Refresh) method.

The proposed method for refreshing a DRAM may offer multiple advantages and technical effects:

The row-by-row refresh function, which may be externally triggered by a memory controller, may also be used for standard JEDEC compliant SDRAM memory chips without any changes to the SDRAM memory chips. Thus, refresh cycle time and energy typically required by the SDRAMs can be reduced using the disclosed technique. Actually, it can be shown that the disclosed advanced refresh techniques for state-of-the-art DDR3 as DRAMs can result in an optimized refresh-reduction scheme that is up to 45% more performance-efficient than the internal auto-refresh function, which is—as mentioned above—already highly optimized. It may also be 10% more energy-efficient than the non-optimized row-by-row refresh. The disclosed technique may enhance all of the existing refresh-optimization schemes that use RGR, and it does so without requiring any modifications to the DRAM or the DRAM protocol, i.e., timing specifications of the DRAM. Additionally, the performance and energy improvements of the proposed technique ORGR will be much higher when the DRAM is only partially refreshed.

Thus, the new refresh function/technology may be used with existing, standard SDRAMs further optimizing the throughput and energy efficiency of computer systems. Hence, the SDRAM internal refresh mechanism, i.e., the auto-refresh function, is not used but replaced.

The advantages are basically achieved by an improvement of three DRAM timing parameters while performing the refresh operation: $t_{RAS}$ (the time between an ACT and PRE to the same bank), $t_{RRD}$ (the time between two successive ACT commands); $t_{RP}$ (the time for a PRE command to be completed). All of those optimized parameters may be derived during the initialization and calibration phase of the DRAM. Those optimized parameters may then be used for an external refresh by the novel memory controller using the proposed multi-row, multi-bank refresh function instead of a single trigger for the SDRAM internal (auto-) refresh mechanism.

For normal commands—like read or write—the standard timing specifications—e.g., SDRAM timing specifications—may be used by the memory or DRAM controller. Thus, the normal operation of the SDRAM is not affected at all in terms of additional overhead.

In the following, additional embodiments of the inventive concept for the method, which may also be applicable to the related system, will be described:

According to one preferred embodiment of the method, the DRAM with the internal multi-row multi-bank refresh function is a JEDEC SDRAM, e.g., a typical industry-standard DDR3 DRAM. Today, these are typically used in many applications. Thus, the newly proposed concept may address the majority of the DRAM market. The new external multi-row multi-bank refresh function may be applied to such a JEDEC SDRAM.

According to a specific embodiment of the method, the optimized timing parameters comprise at least one selected out of the group comprising a time between the ACT command and the PRE command ($t_{RAS}$), the time between two successive ACT commands ($t_{RRD}$), a four-bank activate window ($t_{FAW}$), and a time for a PRE command to complete ($t_{RP}$). Typically, the right interrelationship of those timing parameters may deliver the targeted result.

According to one advantageous embodiment, the method may continue to use un-optimized timing parameters for operational commands, in particular read and/or write commands. Thus, the normal JEDEC SDRAM timing specifications may be used unchanged for these operations.

According to another advantageous embodiment of the method, the timing parameters $t_{RAS}$ may be stepwise reduced by issuing PRE commands closer—in particular in terms of time—to the ACT commands until a presence of a data strobe DQS signal is detected in response to an RD (read) command issued afterwards. Accordingly, a pre-value of the optimized $t^*_{RAS}$ timing may be determined in an elegant way. It may be noted that the differential input/output data strobe signals may typically be denoted as DQS/#DQS signal (DQS).

According to a further preferred embodiment, the method may also comprise (a) addressing a first row, e.g. R1, in a first bank of memory cells in the DRAM using a first ACT command, (b) addressing the same first row R1 in the first bank with a PRE command with a timing violating $t_{RAS}$, i.e., with a too short value according to the specification; (c) addressing another row, e.g., R2, in the first bank of the memory cells in the DRAM with a second ACT command after a time $t_{RAS}$ after the first ACT command, (d) addressing the first bank of memory cells in the DRAM by an RD (read) command violating $t_{RCD}$ requirements related to the second ACT command according to the timing specifications of the DRAM (again too short), and (e) determining a reception of wrong output data (input/output DQ signals) from the other row R2 opened with the second ACT command in response to the read command in the first bank. The steps (a) to (e) may be repeated, thereby reducing $t_{RAS}$ stepwise until it is determined that previously written data to the first row R1 may be received by the read command instead of data written to the other row R2.

Thus, the comparison is performed and controlled on the DRAM controller side. Advantageously, the data pattern in R1 and R2 should be different. The different data pattern may have been written to cells before the steps (a) to (e) may be performed. This may be performed as part of the initialization of the proposed sequence of steps. The data pattern used may, e.g., be "0000 0000" vs. "1111 1111". This way, it may be guaranteed that all bits of a byte may conform to the above stated condition.

This way, a stepwise, iterative optimized command sequence may be determined.

According to an additionally preferred embodiment of the method, the optimized timing parameter $t^*_{RAS}$ is determined by the step-wise reduced timing parameter $t_{RAS}$ plus a DRAM clock period. Hence, the best $t_{RAS}$ value, i.e., $t_{RASmin}$ may be calculated by the pre-value of $t^*_{RAS}$ plus $t_{CK}$, wherein $t_{CK}$ is the clock signal of the DRAM.

According to one further advantageous embodiment of the method, the—in particular—external—refreshing of the DRAM may be performed row-by-row, instead of multi-row-wise at once, as in the auto-refresh mechanism of the SDRAMs. In addition to this, the external refreshing of the DRAM may also be performed bank-by-bank. Thus, all cells of the DRAM may be addressed by the inventive refresh concept.

BRIEF DESCRIPTION OF THE SEVERAL VIEWS OF THE DRAWINGS

It should be noted that embodiments of the invention are described with reference to different subject-matter. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matter, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
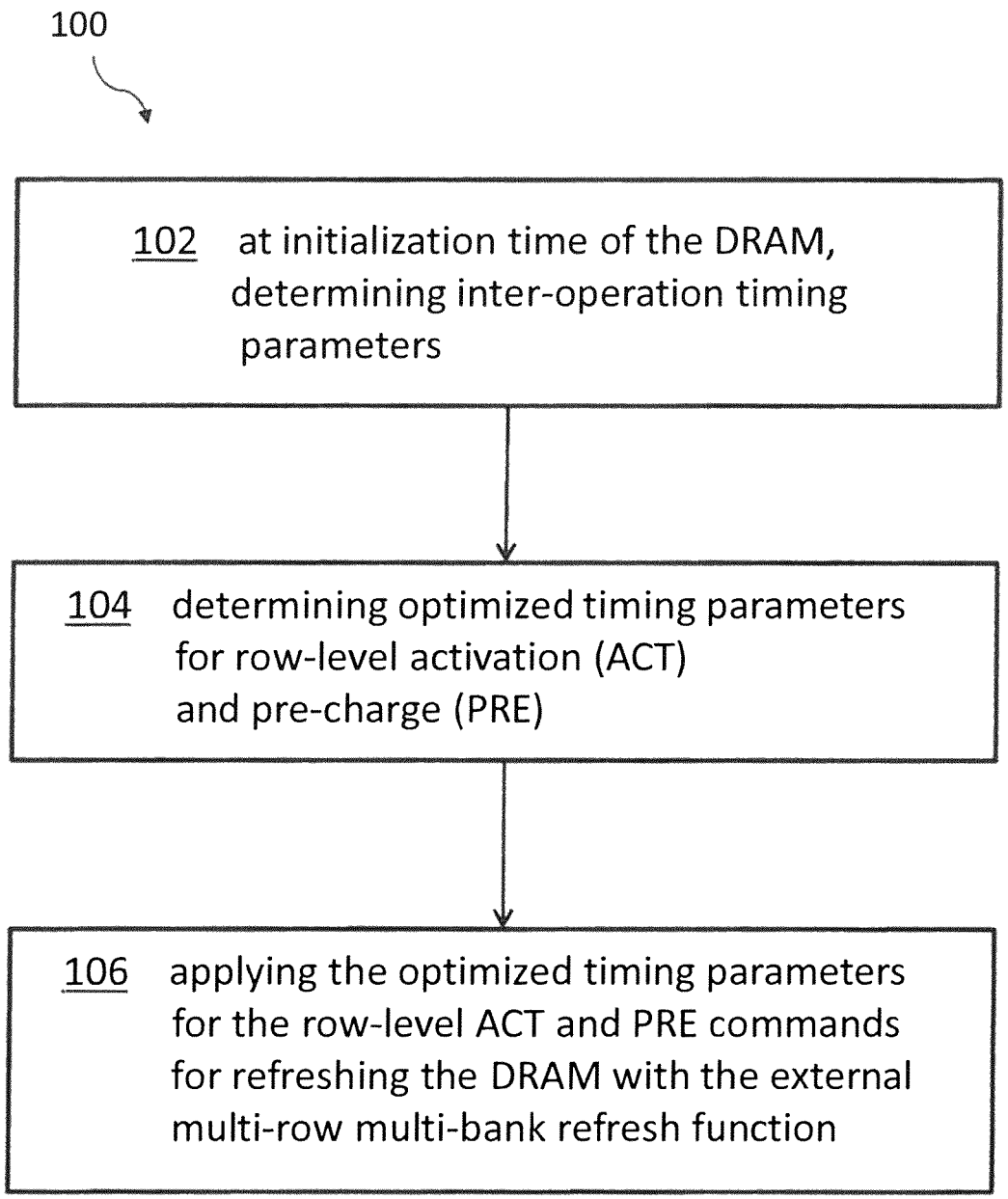

Preferred embodiments of the invention will be described, by way of example only, and with reference to the following drawings:

FIG. 1 shows a block diagram of an embodiment of the inventive method for refreshing a DRAM.

Figure 2:
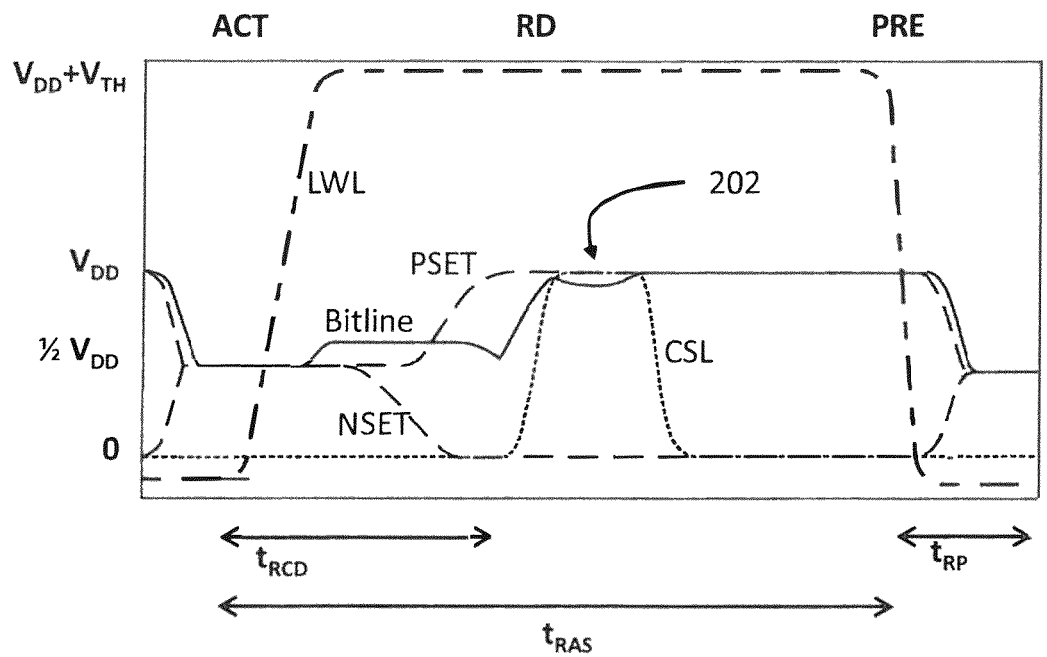

FIG. 2 shows an embodiment of a sensing scheme for a typical read/write operation of a DRAM.

Figure 3:
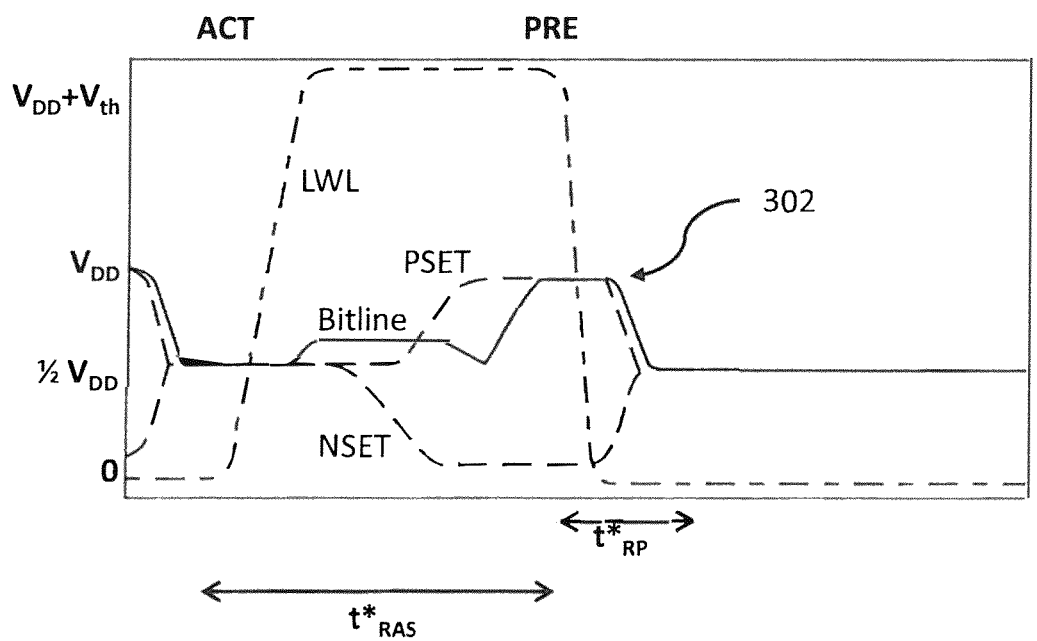

FIG. 3 shows a timing diagram for the refresh operation according to the proposed method.

Figure 4:
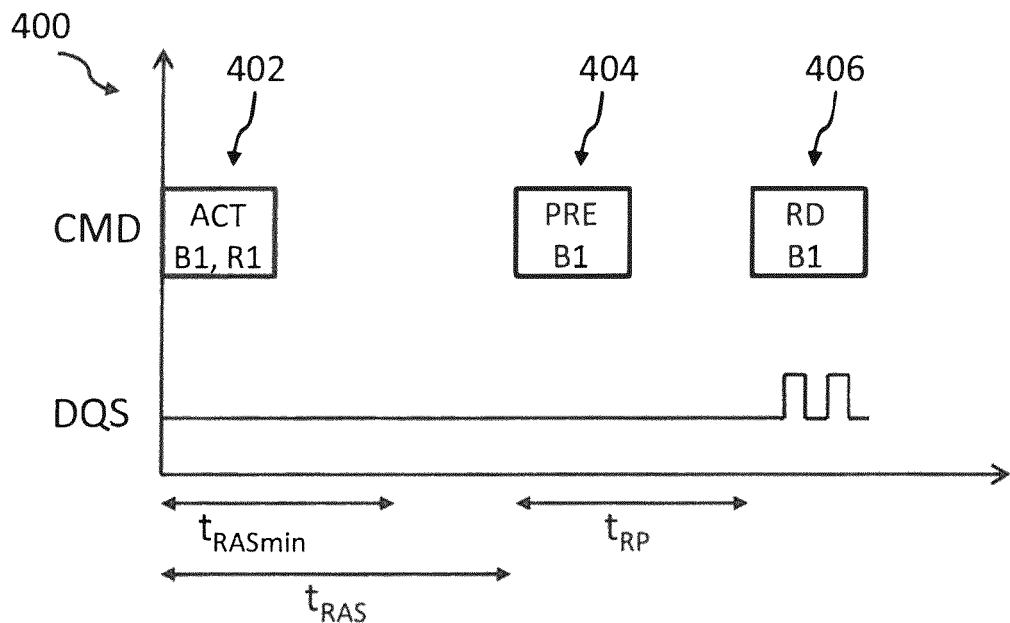

FIG. 4 shows a first implementation alternative for a detection of $t_{RASmin}$.

Figure 5:
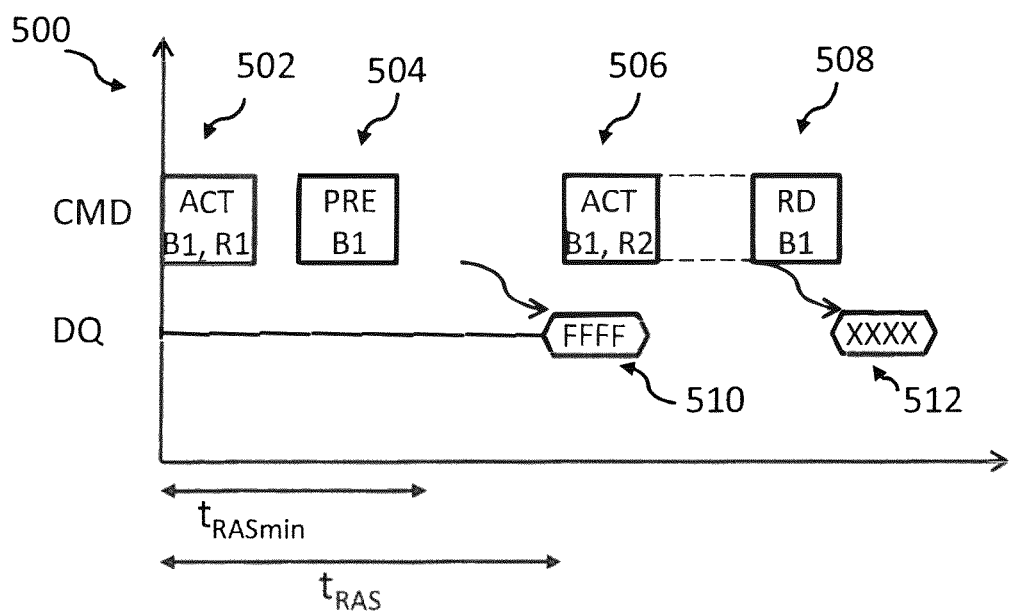

FIG. 5 shows a timing diagram for a second implementation alternative for the detection of $t_{RASmin}$.

Figure 6:
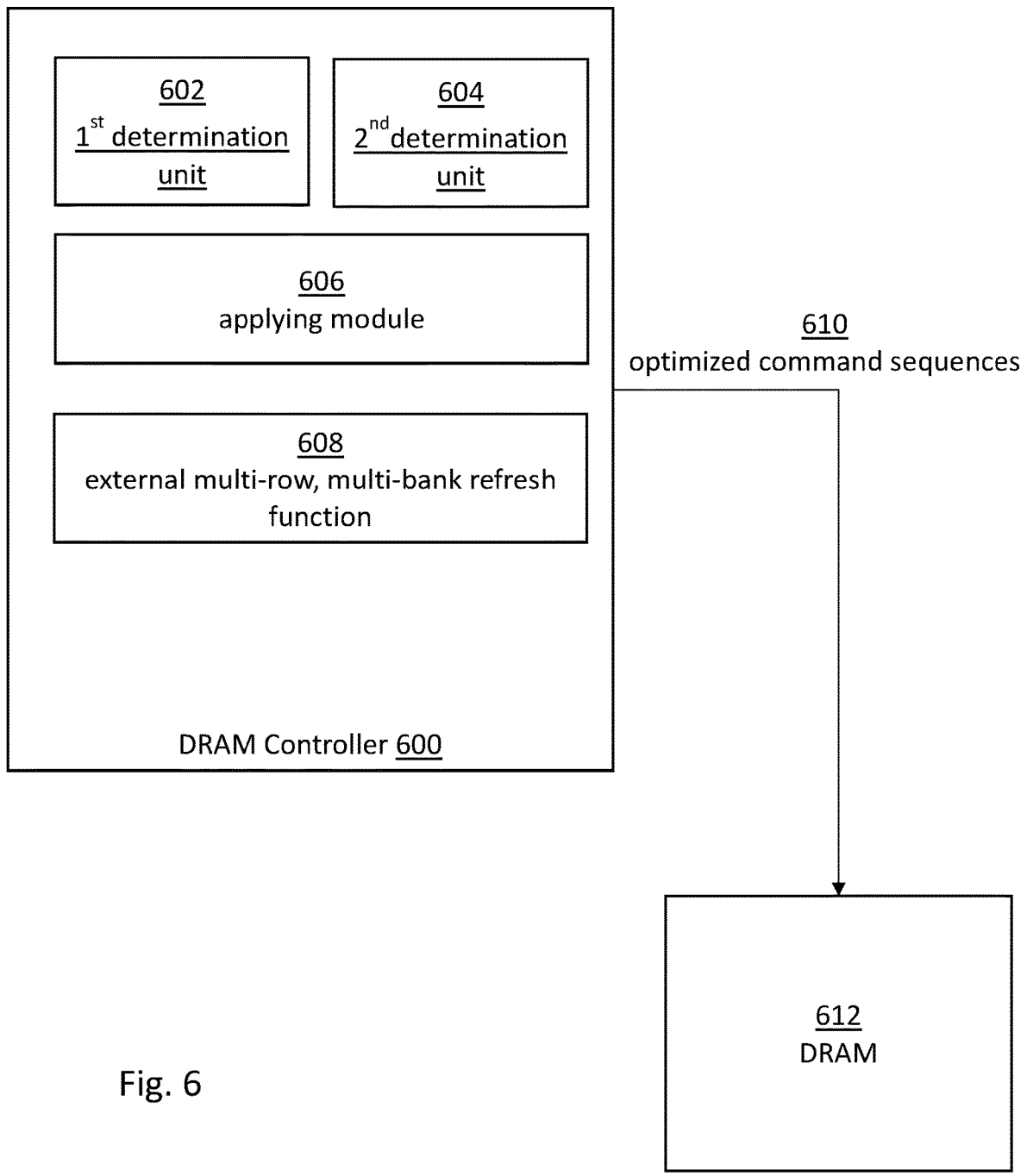

FIG. 6 shows a block diagram of an embodiment of the DRAM controller with required elements.

DETAILED DESCRIPTION

In the context of this description, the following conventions, terms and/or expressions may be used:

The term 'DRAM'—also denoted as Dynamic Random Access Memory—may denote a type of volatile memory that stores each bit of data in a separate capacitor within an integrated circuit. The capacitor may be either charged or discharged; these two states are taken to represent the two values of a bit, conventionally called 0 and 1. Because even "non-conducting" transistors always leak a small amount, the capacitors will slowly discharge, and the information eventually fades unless the capacitor charge is refreshed periodically. Because of this refresh requirement, it is a dynamic memory as opposed to static random-access memory (SRAM) and other static types of memory. Unlike flash memory, DRAM is volatile memory (vs. non-volatile memory), because it loses its data quickly when power is removed. However, DRAM does exhibit limited data remanence.

DRAM is widely used in digital electronics where low-cost and high-capacity memory is required. One of the largest applications for DRAM is the main memory (colloquially called the "RAM") in modern computers, and the main memories of components used in these computers such as graphics cards.

The advantage of a DRAM is its structural simplicity: only one transistor and a capacitor are required per bit, compared to four or six transistors in SRAM (static RAM). This allows DRAM to reach very high densities. The transistors and capacitors used are extremely small; billions can fit on a single memory chip. Due to the dynamic nature of its memory cells, DRAM consumes relatively large amounts of power requiring different ways for managing the power consumption.

The term 'JEDEC SDRAM' denotes a dynamic RAM according to specifications of the JEDEC Solid-State Technology Association comprising the internal auto-refresh mechanism needing only one external trigger in order to perform a multi-row, multi-bank refresh internally and autonomous inside the DRAM chip. Only one trigger signal is required from the DRAM controller in order to perform the internal auto-refresh function of the SDRAM chip.

The term 'internal multi-row, multi-bank auto-refresh function' denotes an autonomous refresh of the DRAM according to the JEDEC Solid-State Technology Association specifications.

The term 'initialization time' denotes a time period when a memory system may first be powered-up. This may typically be the time a related computer system may be switched on.

The term 'inter-operation timing parameters' denotes timing specifications—in particular specific time values—between specific operations or commands. Here, the timing between ACT and PRE (initial value for $t_{RAS}$ only), as well as, the time between two successive ACT commands ($t_{RRD}$), a four-bank activate window ($t_{FAW}$) and a time for a PRE command to complete ($t_{RP}$) are used for the external multi-row, multi-bank refresh function. It may again be noted that the function may be a sequence of individual commands issued by the DRAM controller.

The term 'optimized timing parameter' denotes timing parameters—in particular $t_{RASmin}$—for optimally perform the external refresh function of the SDRAM.

The term 'row-level activation (ACT)' denotes an activation command to open a row in a particular bank. SDRAM chips may have a multi-bank architecture and may be organized in banks, rows and columns. Many chips are combined on a memory module in order to increase the word width. This may be called a memory configuration.

The term 'pre-charge (PRE)' denotes a command for closing a row in a particular bank. So, there may be a constant change between a status 'idle' and 'active'. In order to be changed from 'idle' to 'active', an ACT command is used; to change from 'active' to 'idle', a PREcharge command may be used.

The term 'DQ signal' denotes a valid input/output data signal—here an output signal (or signals) from a memory device.

The term 'DQS signal' denotes a valid input/output data strobe signal—here an output signal (or signals) from a memory device.

The term 'RD (read) command' denotes that a read burst may be initiated to move data from multiple memory cells of a row buffer to the input/output data signals defined above as DQ.

The term '$t_{RCD}$' denotes the time a Row AddresS (RAS) to Column AddresS (CAS) Delay. Once a row address is sent to the memory controller, there is a delay of this number of cycles before accessing one of the row's columns. So, if a row has not been selected, this means one has to wait $t_{RCD}$ before issuing an RD command to the DRAM.

The term 'wrong data' denotes unexpected data. If, for example, a data pattern has been written to a memory cell and the content of the memory cells is read later-on and compared to the originally written data pattern, the data are considered "right" if they are identical. If the written and read data are different, they are considered "wrong".

In the following, a detailed description of the figures will be given. All instructions in the figures are schematic. A block diagram of an embodiment of the inventive method for refreshing a DRAM is initially provided and then further embodiments, as well as embodiments of the DRAM controller, will be described.

FIG. 1 shows a block diagram of an embodiment of the inventive method for refreshing a DRAM with an external multi-row multi-bank refresh function. In a basic form, the method can be summarized as shown in the flowchart of FIG. 1. The method 100 for refreshing a DRAM with an external multi-row, multi-bank refresh function based on optimized command sequences comprises determining (102) at initialization time of the DRAM—in particular, initialization and calibration time—inter-operation timing parameters for the external multi-row, multi-bank refresh function. Again, this is not a single command but a sequence of different commands.

The method also comprises determining (104) optimized timing parameters for row-level activation (ACT) and pre-charge (PRE) commands, and applying (106) the optimized timing parameters for the row-level ACT and PRE commands for refreshing the DRAM as part of the external multi-row multi-bank refresh function. This external multi-row multi-bank refresh function is used as a replacement of the internal auto-refresh function of a typical SDRAM chip. The internal auto-refresh function stays active in the SDRAM but will not be used due to the higher efficiency of the newly proposed concept.

FIG. 2 shows an embodiment of a sensing scheme for a nominal read/write operation of a DRAM. The ACT command triggers the local work line (LWL) drivers and they raise LWL to a voltage above $V_{DD}$ plus $V_{TH}$. Bit lines develop a small charge, which is amplified by the primary sense-amp (PSA) to $V_{DD}$. When the bit line voltage is raised to approximately 92% of $V_{DD}$, a RD (read) command is issued, raising the column select line (CSL). This would create a drop 202 in the bit line voltage until the CSL is lowered; this is increasing the restoration time which is reflected in $t_{RAS}$ specified by JEDEC. But, in case of RGR, a RD command does not follow an ACT command, and therefore there is no voltage drop 302 in the bit line—as shown in FIG. 3. This enables the fast restoration of bit lines and therefore $t_{RAS}$ can be reduced.

It may be kept in mind that SDRAM vendors use a built-in analog timer (practically the $t_{RASmin}$ timer), which prevents pre-charging already activated rows before the minimum restoration time is over—this ensures that the data is not disrupted by an early PREcharge. In contrast to this traditional method, the proposed concept relies on a reverse engineering of the DRAM specifics during initialization (and calibration) time to find out the $t_{RASmin}$ using any of the proposed methods.

FIG. 3 shows a timing diagram for the refresh operation according to the disclosed method. The new reduced timing parameters $t^*_{RP}$ and $t^*_{RAS}$ are shown. Comparing FIG. 2 and FIG. 3 it is obvious that $t^*_{RAS}$ is much smaller than $t_{RAS}$ of the original JEDEC specifications for the DRAM.

FIG. 4 shows a timing diagram 400 for a first implementation alternative for a $t_{RASmin}$ detection. The memory controller initially issues an ACT command 402 to any bank, e.g., bank B1 and a row, e.g., R1. Then, a PRE command 404 is issued after $t_{RAS}$ followed by a RD command 406 after $t_{RP}$ (the time for a PRE command to be completed). The RD command, which comes after the PRE command, will be ignored by the DRAM because bank B1 is already pre-charged, and therefore the DQ(S) (data signal) will not be present on the bus. Then, the controller gradually reduces the $t_{RAS}$ by issuing the PRE command 404 time-wise closer to the ACT command 402 until the presence of DQ(S) is detected in response to the RD command (406). When the PRE command comes within the $t_{RASmin}$ time, the DRAM ignores the PRE command to prevent data restoration failure, and therefore the RD command 406, which comes later, will read from the previous activated bank. Therefore, the presence of DQ(S) indicates that the DRAM detects a correctly timed RD command 406, and the controller takes the then valid timing, i.e., corresponding $t^*_{RAS}+t_{CK}$ (the DRAM clock period) as $t_{RASmin}$ for performing the optimized row granular refresh (ORGR), according to the proposed method.

FIG. 5 shows a timing diagram for a second implementation alternative for a determination of a minimum of $t_{RAS}$, i.e., $t_{RASmin}$. The memory controller may perform this test if the first implementation alternative—i.e., if the implementation alternative according to FIG. 4—fails.

Initially, the memory controller issues an ACT command 502 to any memory bank, e.g., B1 and row, e.g., R1. Then, it sends a PRE command 504 to the same memory bank, violating the $t_{RAS}$. Later, $t_{RAS}$ after the first ACT command 502, it issues another ACT command 506 to the same bank B1, but to a different row, e.g., R2. Closely followed by the second ACT command 506, a RD command 508 is issued violating the $t_{RCD}$. The memory controller will consequently receive wrong data 512 in response to this RD command 508 because of the $t_{RCD}$ violation. The controller then repeats issuing the same set of commands (ACT 502, PRE 504, ACT 506, RD 508) by reducing the $t_{RAS}$ step-by-step, and snoops the data bus for the correct data in each step. When the second ACT 506 command comes with the $t_{RASmin}$ interval of the first ACT command, the DRAM ignores it and issues the read data 510 from the first activated row, delivering the correct data 510 because there is no $t_{RCD}$ violation. Finally, the value of $t^*_{RAS}+t_{CK}$ for which the correct data is observed on the data bus in response to the RD command is taken as $t_{RASmin}$ for performing the Optimized Row Granular Refresh (ORGR), according to the proposed method.

FIG. 6 shows a more formal block diagram of an embodiment of the DRAM controller 600 for refreshing a DRAM 612 with an external multi-row, multi-bank auto-refresh function 608 based on optimized command sequences 610. The DRAM controller comprises a first determination unit 602 adapted for, at initialization and calibration time of the DRAM, determining inter-operation timing parameters for the external multi-row, multi-bank refresh function 608, a second determination unit 604 adapted for determining optimized timing parameters for (row-level activation (ACT) and pre-charge (PRE) commands, i.e., $t_{RASmin}$, and an applying module 606 adapted for applying the optimized timing parameters 610 for the row-level ACT and PRE commands for refreshing the DRAM 612 with the external multi-row multi-bank refresh function 608.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, and apparatus (systems), according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

The invention claimed is:

1. A method for refreshing a dynamic random access memory (DRAM) with an external multi-row, multi-bank refresh function based on optimized command sequences, the method comprising:
  determining, at an initialization time of the DRAM by an external memory controller, inter-operation timing parameters for the external multi-row, multi-bank refresh function, wherein the initialization time is a time period when the DRAM is first powered-up, wherein the external memory controller is external to the DRAM;
  determining, at the initialization time by the external memory controller, optimized timing parameters for row-level activation (ACT) and pre-charge (PRE) commands by issuing commands to the DRAM; and
  applying, by the external memory controller, the optimized timing parameters for the row-level ACT and PRE commands for refreshing the DRAM with the external multi-row multi-bank refresh function.

2. The method of claim 1, wherein the DRAM with an internal multi-row multi-bank auto-refresh function is a Joint Electron Device Engineering Council (JEDEC) synchronous DRAM (SDRAM).

3. The method of claim 1, wherein the optimized timing parameters comprise at least one selected out of the group comprising a time between the ACT command and the PRE command ($t_{RAS}$), a time between two successive ACT commands ($t_{RRD}$), a four-bank activate window ($t_{FAW}$), and a time for a PRE command to complete ($t_{RP}$).

4. The method of claim 1, wherein the refreshing the DRAM is performed row-by-row.

5. The method of claim 3, wherein non-optimized timing parameters are used for operational commands.

6. The method of claim 3, wherein the commands issued to the DRAM comprise first and second ACT commands and a PRE command, the method further comprising:
  (a) addressing a first row in the first bank of memory cells in the DRAM using a first ACT command;
  (b) addressing the same first row in the first bank with a PRE command with a timing violating $t_{RAS}$;
  (c) addressing another row in the first bank of the memory cells in the DRAM with a second ACT command after a time $t_{RAS}$ after the first ACT command;
  (d) addressing the first bank of memory cells in the DRAM by a read command violating $t_{RCD}$ requirements related to the second ACT command;
  (e) determining a reception of wrong data (DQ) from the other row opened as second ACT command in response to the read command in the first bank; and
  repeating the steps (a) to (e), thereby reducing $t_{RAS}$ stepwise until it is determined that previously written data to the first row is received by the read command instead of data written to the other row.

7. The method of claim 6, wherein different data are written into the first row if compared to the second row.

8. A method for refreshing a dynamic random access memory (DRAM) with an external multi-row, multi-bank refresh function based on optimized command sequences, the method comprising:
  determining, at initialization time of the DRAM, inter-operation timing parameters for the external multi-row, multi-bank refresh function;
  determining optimized timing parameters for row-level activation (ACT) and pre-charge (PRE) commands; and
  applying the optimized timing parameters for the row-level ACT and PRE commands for refreshing the DRAM with the external multi-row multi-bank refresh function,
  wherein the optimized timing parameters comprise at least one selected out of the group comprising a time between the ACT command and the PRE command ($t_{RAS}$), a time between two successive ACT commands ($t_{RRD}$), a four-bank activate window ($t_{FAW}$), and a time for a PRE command to complete ($t_{RP}$), and wherein the timing parameter $t_{RAS}$ is stepwise reduced by issuing PRE commands closer to the ACT commands until a presence of a DQS signal is detected in response to a read command issued afterwards.

9. The method of claim 8, wherein an optimized timing parameter $t_{RASmin}$ is determined by the step-wise reduced timing parameter $t^*_{RAS}$ plus a DRAM clock period.

10. The method of claim 8, wherein when determining the timing parameter $t_{RAS}$ by stepwise reduction fails, the commands issued to the DRAM further comprise first and second ACT commands and a PRE command, the method further comprising:
   (a) addressing a first row in the first bank of memory cells in the DRAM using a first ACT command;
   (b) addressing the same first row in the first bank with a PRE command with a timing violating $t_{RAS}$;
   (c) addressing another row in the first bank of the memory cells in the DRAM with a second ACT command after a time $t_{RAS}$ after the first ACT command;
   (d) addressing the first bank of memory cells in the DRAM by a read command violating $t_{RCD}$ requirements related to the second ACT command;
   (e) determining a reception of wrong data (DQ) from the other row opened as second ACT command in response to the read command in the first bank; and
   repeating the steps (a) to (e), thereby reducing $t_{RAS}$ stepwise until it is determined that previously written data to the first row is received by the read command instead of data written to the other row.

11. A dynamic random access memory (DRAM) controller for refreshing a DRAM with an external multi-row, multi-bank refresh function based on optimized command sequences, the DRAM controller comprising:
   a first determination unit adapted for, at initialization time of the DRAM, determining inter-operation timing parameters of the external multi-row, multi-bank refresh function, wherein the initialization time is a time period when the DRAM is first powered-up, wherein the DRAM controller is external to the DRAM;
   a second determination unit adapted for determining, at the initialization time of the DRAM, optimized timing parameters for row-level activation (ACT) and precharge (PRE) commands by issuing commands to the DRAM; and
   an applying module adapted for applying the optimized timing parameters for the row-level ACT and PRE commands for refreshing the DRAM with the external multi-row multi-bank refresh function.

12. The DRAM controller of claim 11, wherein the DRAM with an internal multi-row multi-bank auto-refresh function is a Joint Electron Device Engineering Council (JEDEC) synchronous DRAM (SDRAM).

13. The DRAM controller of claim 11, wherein the optimized timing parameters comprise at least one selected out of the group comprising a time between the ACT command and the PRE command ($t_{RAS}$), the time between two successive ACT commands ($t_{RRD}$), a four-bank activate window ($t_{FAW}$) and a time for a PRE command to complete ($t_{RP}$).

14. The DRAM controller of claim 11, wherein the refreshing the DRAM is performed row-by-row.

15. The DRAM controller of claim 13, wherein non-optimized timing parameters are used for operational commands.

16. The DRAM controller of claim 13, wherein the commands issued to the DRAM include PRE and ACT commands, and wherein the timing parameter $t_{RAS}$ is stepwise reduced by issuing PRE commands closer to the ACT commands until a presence of a DQS signal is detected in response to read command issued afterwards.

17. The DRAM controller of claim 13, wherein the commands issued to the DRAM comprise first and second ACT commands and a PRE command, the DRAM controller further comprising:
   (a) addressing a first row in the first bank of memory cells in the DRAM using a first ACT command;
   (b) addressing the same first row in the first bank with a PRE command with a timing violating $t_{RAS}$;
   (c) addressing another row in the first bank of the memory cells in the DRAM with a second ACT command after a time $t_{RAS}$ after the first ACT command;
   (d) addressing the first bank of memory cells in the DRAM by a read command violating tRCD requirements related to the second ACT command;
   (e) determining a reception of wrong data (DQ) from the other row opened as second ACT command in response to the read command in the first bank; and
   repeating the steps (a) to (e), thereby reducing $t_{RAS}$ stepwise until it is determined that previously written date to the first row is received by the read command instead of data written to the other row.

18. The DRAM controller of claim 16, wherein an optimized timing parameter $t_{RASmin}$ is determined by the stepwise reduced timing parameter $t^*_{RAS}$ plus a DRAM clock period.

19. The DRAM controller of claim 17, wherein different data are written into the first row if compared to data written to the second row.

* * * * *